(12) United States Patent
Akaogi

(10) Patent No.: US 6,205,084 B1
(45) Date of Patent: Mar. 20, 2001

(54) BURST MODE FLASH MEMORY

(75) Inventor: Takao Akaogi, Cupertino, CA (US)

(73) Assignee: Fujitsu Limited (JP)

( * ) Notice: Subject to any disclaimer, the term of this patent is extended or adjusted under 35 U.S.C. 154(b) by 0 days.

(21) Appl. No.: 09/467,758

(22) Filed: Dec. 20, 1999

(51) Int. Cl.$^7$ .................................................. G11C 3/00
(52) U.S. Cl. ....................... 365/233; 365/194; 365/230.8; 365/230.5
(58) Field of Search .................................. 365/233, 194, 365/238.5, 189.01, 230.08

(56) References Cited

U.S. PATENT DOCUMENTS

| 5,566,108 | * | 10/1996 | Kitamura | ............................... | 365/233 |
| 5,940,344 | * | 8/1999 | Murai et al. | ........................... | 365/233 |
| 6,005,825 | * | 12/1999 | Lee et al. | ............................... | 365/233 |
| 6,061,294 | * | 5/2000 | Koshikawa | ............................ | 365/233 |
| 6,101,136 | * | 8/2000 | Mochida | ................................ | 365/194 |

* cited by examiner

*Primary Examiner*—Tan T. Nguyen
(74) *Attorney, Agent, or Firm*—Christie, Parker & Hale, LLP

(57) ABSTRACT

A clock generator circuit in response to an external output enable signal generates an internal clock signal that is delayed to increase the reliability of the data outputted from the flash memory. A clock trigger generator circuit by decoding address signals generates an internal clock signal to reduce the latency time of the output of data with respect to the external clock signal. A bypass signal is provided to disable the clock trigger generator circuit. An output circuit provides a bypass data path to additionally reduce the latency time of the outputting of data for a burst mode flash memory. A decoder counter selector circuit provides a "look-ahead" address decoding scheme to reduce the time needed to output data.

7 Claims, 14 Drawing Sheets

BURST MODE FLASH MEMORY

BACKGROUND OF THE INVENTION

The present invention relates to semiconductor storage systems and methods, and more particularly, to methods and systems of performing memory operations for accessing data in a burst mode transfer data storage environment, especially non-volatile semiconductor memory devices such as flash memory devices.

Generally, a flash memory device comprises an address sequencer, row and column decoders, sense amplifiers, write amplifiers, and a memory cell array. An example of a flash memory device is described in U.S. Pat. No. 5,490,107, the disclosure of which is herein incorporated by reference. The memory cell array contains a plurality of memory cells arranged in rows and columns. Each memory cell is capable of holding a single bit of information.

The memory cells in the memory cell array of a flash memory device are generally grouped into sub-arrays called memory cell blocks. Each memory cell block is coupled to a sense amplifier and a write amplifier. The write amplifier (W/A) applies a set of predetermined voltages to store information in the selected memory cells. This action is referred to as a program or write operation. Similarly, a set of predetermined voltages applied to the selected memory cells allows information to be discriminated and retrieved by the sense amplifier (S/A). This action is referred to as a read operation.

Generally, a read operation or a write operation is initiated in response to external signals provided by a controller, such as a processor. Likewise, information read or written into the flash memory device is generally transferred to and from the processor. In most cases, the amount of information transferred is large. Also, the rate at which the information is propagated from a controller to the flash memory device and vice versa is ever increasing. Therefore, increasing performance demands are constantly being imposed on a processor, the flash memory device, and also the communication interface between the processor and the flash memory device.

For instance, the processor, flash memory and other peripheral devices must compete for the use of the communication interface, e.g., a bus. However, a bus has a limited bandwidth for transferring information to and from the peripherals. Therefore, efficient bus utilization is generally highly desirable. Burst mode technology is one way to efficiently utilize the bus and to increase bus bandwidth. Burst mode technology combines individual read requests and write requests to memory into aggregates, with each aggregate being formed of many individual read requests or write requests. Burst mode technology transfers these aggregates in bursts, such that an aggregate of individual read requests are transferred followed by an aggregate of individual write requests. Therefore, groups of read or write requests can be serviced at the same time instead of individually, and therefore decrease bus overload and effectively increase bus bandwidth.

Also, the speed of read and write operations is often increased in order to realize higher performance flash memory devices. One such method to increase the speed of read operations is synchronization. By synchronizing the read operations to an external clock, the speed of the read operations is improved.

However, often the processor selects or enables only one of the peripherals to utilize the bus at any given time. The selection of the peripherals is usually performed in a predetermined order or randomly. Under certain conditions, a read operation may take longer to stabilize when the flash memory is enabled. The delay is often greater than one clock period of an external clock and thus disrupts the synchronization of the read operation to the external clock. As a result, incorrect data can be read from the selected memory cell. Therefore, the use of both burst mode technology and flash memory operations is therefore problematical.

Furthermore, the use of burst mode technology, generally, require an initial latency time in performing a memory operation. In some cases, the initial latency is required to prevent any disruption in operation of a peripheral operating at a low clock frequency. However, in cases in which the peripheral, such as the flash memory device, that operates at a high clock frequency, the initial latency can be bypassed to improve the performance speed of the flash memory device. Accordingly, methods and systems which overcome the obstacles of using of both burst mode technology and flash memory operations are desirable. Furthermore, increasing performance speed of the flash memory device using burst mode technology is also desirable.

SUMMARY OF THE INVENTION

The present invention therefore provides a burst mode flash memory device. In one embodiment the burst mode flash memory device synchronously operates with an external clock and comprises a memory cell array having a plurality of memory cells, each memory cell storing data. The memory device additionally includes input circuits selecting a subset of memory cells and generating an internal clock synchronized to the external clock, with the generation of the internal clock delayed upon receipt of a predefined control signal. The memory device additionally includes reader circuits fetching data stored in the subset of memory cells selected, and output circuits outputting the data fetched in a predetermined grouping and synchronously with the internal clock. In a further embodiment the burst mode flash memory device comprises a delay circuit receiving a signal corresponding to the predefined control signal and generating an internal enable signal which is a delayed version of the predefined control signal. The input circuit additionally comprises an internal clock generator circuit generating internal clock signals using an external clock signal, with at least one of the internal clock signals being generated only when the internal enable signal is in a first state.

In an additional embodiment a flash memory device has a memory cell array, an address decoder for processing address information used in accessing the memory cell array, a method of increasing reliability of access of the memory cell array comprising receiving an output enable signal and forming a delayed enable signal. A method additionally comprises providing a delayed output enable signal to an internal clock generator, the delayed output enable signal being used to enable an internal clock signal, and generating the internal clock signal for use in accessing the memory cell array.

A further embodiment of the present invention comprises a flash memory device including a handshake circuit comprising a comparator which compares least significant address signals generated by the address signal generator and forms a control signal, a shift circuit for phase shifting the external clock signal, and a gate circuit for gating the shifted clock signal.

A further embodiment of the present invention comprises a flash memory device having an output buffer comprising a first data path and a second data path. The first data path receives an input signal and outputs an output signal and includes a plurality of latches. A second data path includes a portion of the first data path and a bypass portion by passing at least one latch in the first data path, with the second data path being controlled by a gate controlled by a signal indicative of a transition and an address signal. In a further embodiment the present invention comprises a decoder counter selector for a flash memory device. The decoder counter selector includes comparators for finding bit patterns of a plurality of address signals. The decoder counter selector further includes a plurality of shift register in a sequence, each shift register receiving two match signals additionally received by shift registers adjacent in the sequence and outputting an output signal for selecting a latch buffer for driving an output of the memory.

Many of the attendant features of this invention will be more readily appreciated as the same becomes better understood by reference to the following detailed description considered in connection with the accompanying drawings.

DESCRIPTION THE DRAWINGS

DETAILED DESCRIPTION

I. Overview

Figure 1:
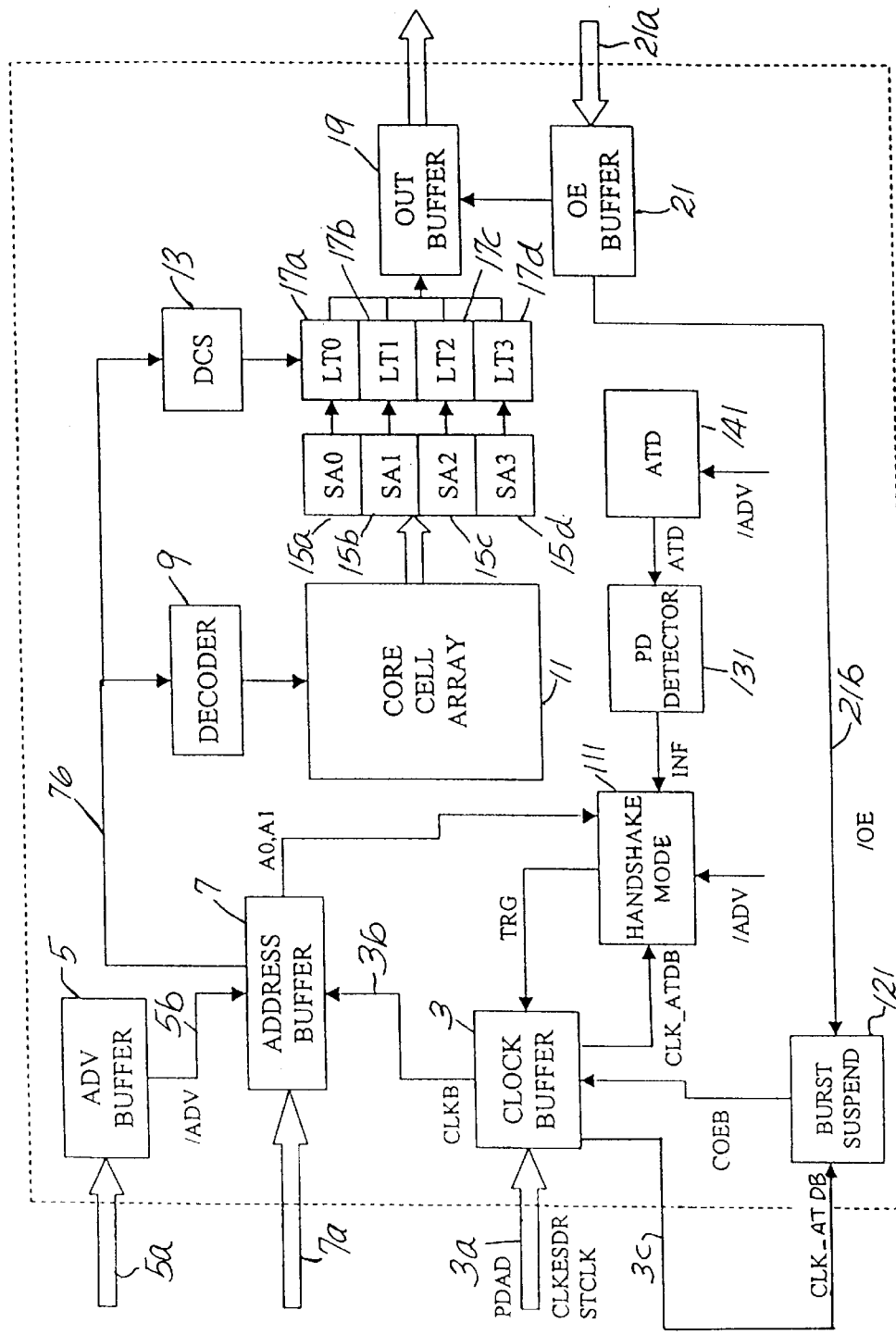
FIG. 1 illustrates a simplified block diagram of a burst mode flash memory device of the present invention.

FIG. 1 illustrates a simplified block diagram of one embodiment of a burst mode flash memory device of the present invention. The burst mode flash memory includes a clock buffer 3, an advance address buffer 5 and an address buffer 7. As the present invention pertains to read operations, for clarity, portions of the burst mode memory that are utilized to perform write or program operations are not described. As one skilled in the art would recognize, program operations can be implemented using a multitude of logic gate configurations. Each buffer, the clock buffer, advance address buffer and the address buffer, operate in response to external signals. The external signals, in one embodiment, are provided by a processor through a system bus. In this embodiment, the burst mode memory receives three external signals, external clock and power down signals 3a, an advance address signal 5a, and address signals $A_0-A_N$ 7a. The address signals $A_0-A_N$, which correspond to $2^{N+1}$ memory locations, designate an address of a specific memory location.

The clock buffer 3 receives the external clock and power down signals 3a and generates a buffered clock signal CLKB 3b. The buffered clock signal 3b is synchronized to the external clock signal CLKESDR. Similarly, the advance address buffer 5 receives the advance address signal 5a to generate an internal advance address signal 5b. The buffered advance address signal 5b represents each sequential increment of the address signals $A_0-A_N$. The address buffer 7 receives the buffered clock signal 3b, the internal advance address signal 5b, and address signals $A_0-A_N$ 7a. The address buffer 7 generates internal address signals $A_0-A_N$ 7b, synchronously to the buffered clock signal 3b. At each rising edge of the buffered clock signal 3b, the address buffer sequentially increments the internal address signal $A_0-A_N$. The decoder 9 receives the internal address signals $A_0-A_N$. Similarly, first two bits of the address signals $A_0-A_N$, i.e., address signals $A_0-A_1$, that are generated by the address buffer 7 are provided to a decoder counter selector 13. Based on the internal address signals $A_0-A_N$, the decoder 9 generates column and row signals. The column and row signals select specific memory cells in the core cell array 11 for memory operations, i.e., read operations.

The core cell array 11 contains a plurality of memory cells. Each memory cell is capable of storing a single bit of information, e.g., a binary one or a zero. The memory cells are grouped into subsets of memory cells, typically referred to as memory cell blocks or words. Each memory cell block is coupled to a corresponding sense amplifier. In this embodiment, four sense amplifiers 15a–15d are coupled to the core cell array 11. Simultaneously, each sense amplifier "senses" the information or data stored in the corresponding selected memory cells. In one embodiment, the corresponding selected memory cells correspond to a single memory word or row of memory cells that are accessed simultaneously for a read operation.

Each sense amplifier 15a–15d is also coupled to a respective latch buffer 17a–17d. Each sense amplifier simultaneously forwards the data from the memory cells to each respective latch buffer. Each latch buffer 17a–17d temporarily stores the forwarded data from the respective sense amplifier. Coupled to the latch buffers 17a–17d is the decoder counter selector 13. The decoder counter selector 13 sequentially "triggers" or "enables" each latch buffer 17a–17d to transmit data from a respective latch buffer to an output buffer 19. The decoder counter selector sequentially enables the respective latch buffer based on the address signals $A_0-A_1$. When the latch buffer 17a is enabled, the internal address signal $A_0-A_N$ is incremented. Thus, the sense amplifiers 15a–15d start detecting data of "newly" selected memory cells.

The output buffer 19 is coupled to an output enable buffer 21. The output enable buffer 21 receives an external output enable signal 21a. The external output enable signal, in one embodiment, is supplied by a processor through a system bus to notify the burst mode flash memory to output data. In response to the output enable signal 21a, the output enable buffer 21 generates an internal output enable signal 21b. Based on the internal output enable signal 21b, the output buffer 19 outputs the data received from the respective latch buffers 17a–17d.

The internal output enable signal 21b is supplied to the burst suspend 121. The burst suspend 121 is also supplied an internal clock signal CLK_ATDB generated by the clock buffer 3. The burst suspend 121 supplies a clock output enable signal COEB to signify to the clock buffer 3 to delay or not delay the output of the buffered clock signal CLKB 3b. By manipulating the timing of the buffered clock signal, the burst suspend 121 is also able to manipulate the timing of the output from the output buffer 19.

An address transition detection signal ATD is generated by an address transition generator 141. Whenever a new address is loaded or incremented, the address transition generator outputs the address transition detection signal ATD. The address transition detection signal ATD is supplied to a power down detector 131. The power down detector outputs a disable mode signal INF, if the external clock signal CLKESDR has too low of a frequency to use a handshake mode that is described in greater detail below.

A handshake mode 111 is supplied the internal clock signal CLK_ATDB, address signals $A_0$ and $A_1$, the advance address signal /ADV 5a and the disable mode signal INF. The handshake mode 111 also manipulates the timing of the buffered clock signal CLKB and therefore is also able to manipulate the output from the output buffer 19. If the disable mode signal INF is not active, the handshake mode 111 manipulates the timing of the buffered clock signal CLKB by supplying a trigger signal TRG to the clock buffer 3. By manipulating the timing of the buffered clock signal CLKB, the initial address is loaded quick and thus output from the output buffer 19 is also quick.

Therefore, during a read operation, detected or sensed data is stored in corresponding the corresponding latch buffers 17a–17b, synchronously to the internal clock signal 3b. Likewise, the sensed data is transferred out synchronously to the external clock signal CLKESDR. The synchronous transfers allow the speed for a read operation to be maximized. However, each read operation depends on the buffered clock signal generated by the clock buffer 3.

II. Clock Buffer and Burst Suspend

Figure 2A:
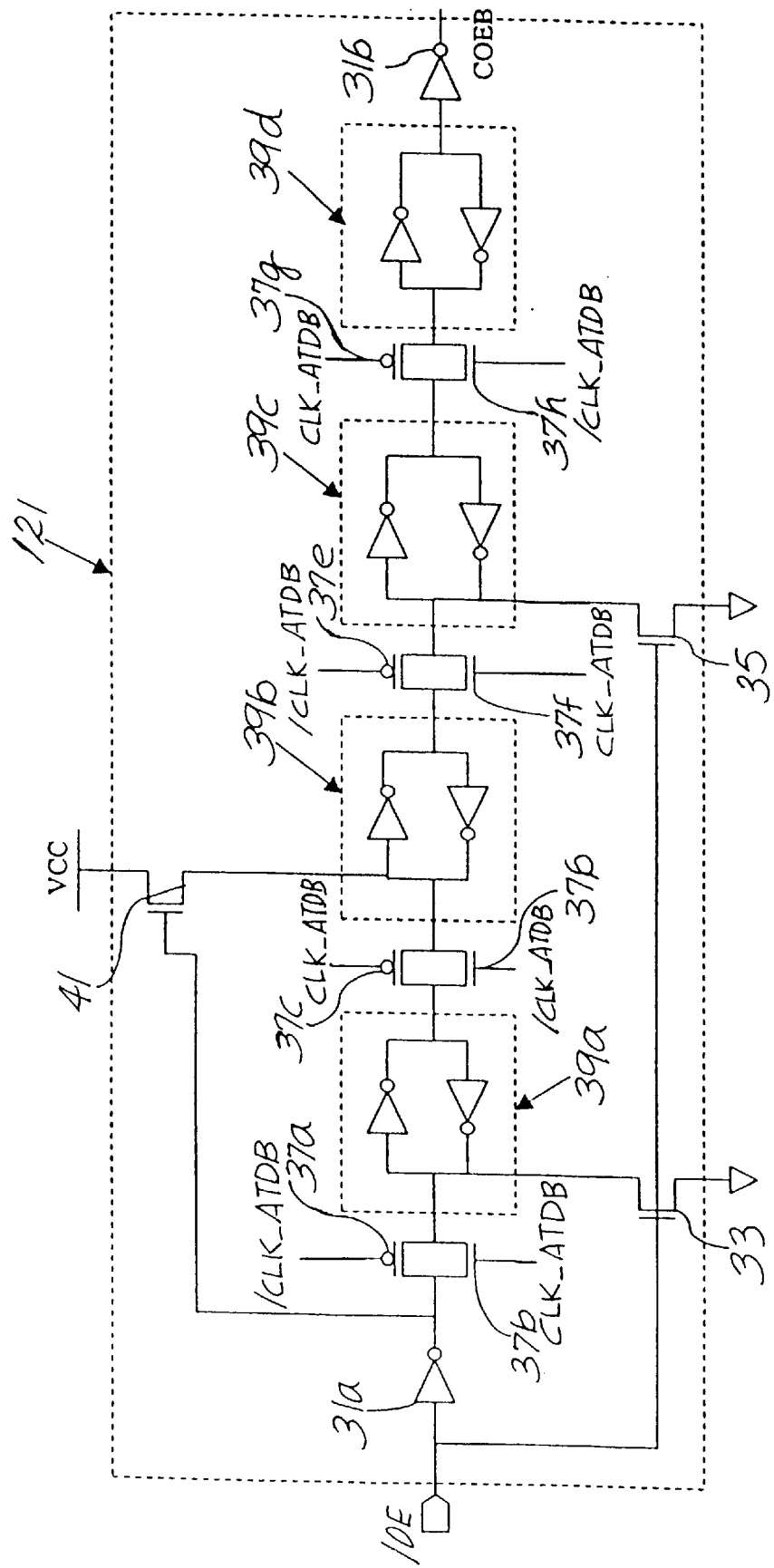
FIGS. 2A and 2B illustrate circuit semi-schematics of clock buffer and burst suspend circuits of the flash memory device of FIG. 1.
Figure 2B:
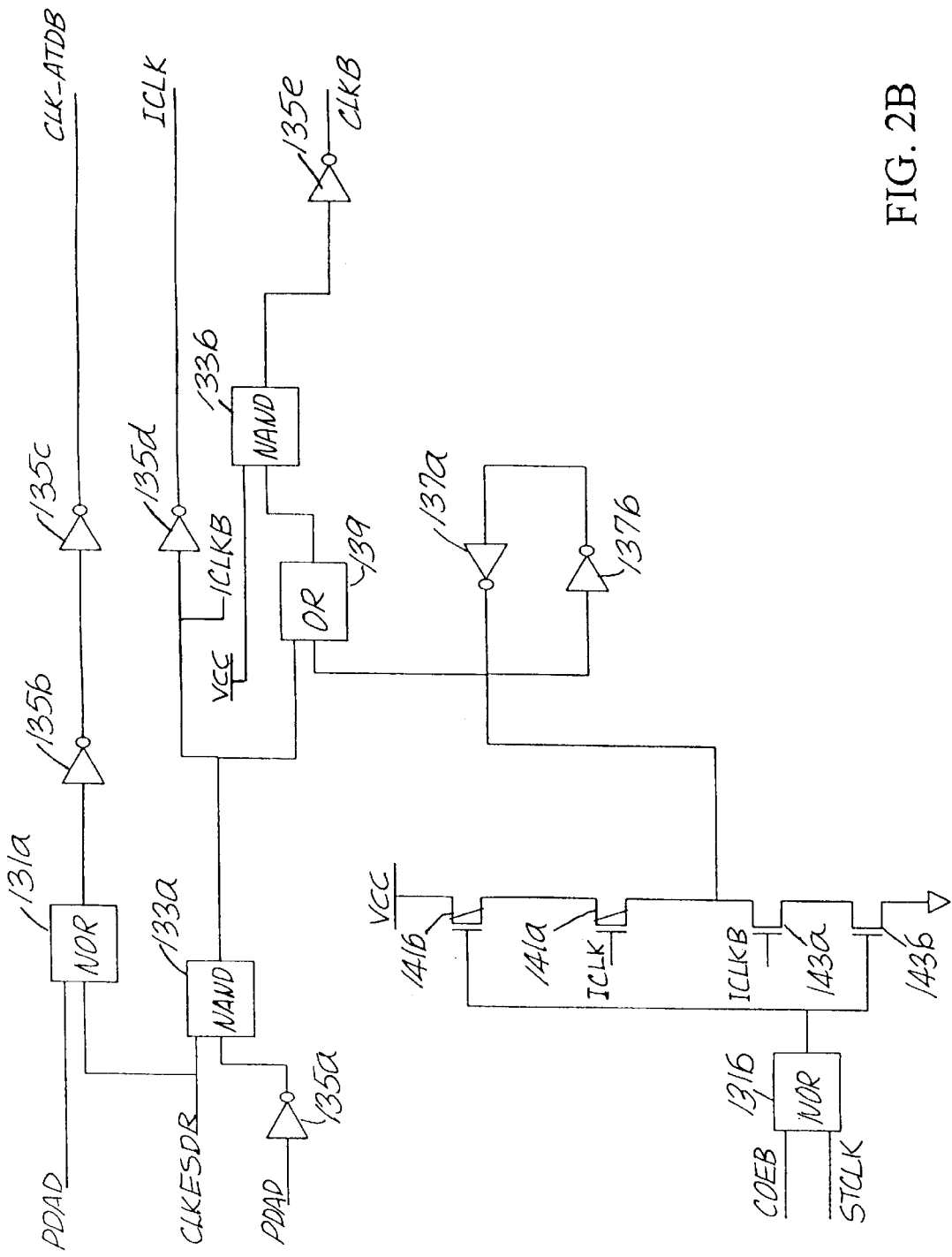

FIGS. 2A and 2B illustrate schematics of one embodiment of the clock buffer and burst suspend of the burst mode flash memory circuit of the present invention shown in FIG. 1. The internal output enable signal /OE 21b (FIG. 1) is provided as an input to the burst suspend 121. The input of the burst suspend is coupled to an input of a first inverter 31a and gates of a first transistor 33 and a second transistor 35. Sources of the first transistor 33 and the second transistor 35 are both coupled to ground. When the internal output enable signal /OE is high, the first and second transistors turn on and thereby create paths to ground.

An output of the first inverter 31a is coupled to drains of a first pair of clock transistors 37a,b. The first pair of clock transistors have commonly coupled drains and sources with one transistor being a p-channel (37a) and the other being a n-channel (37b). A gate of the p-channel transistor supplied an inverse internal clock signal CLK_ATDB is and the n-channel transistor coupled to the internal clock signal CLK_ATDB (FIG. 1). At the rising edge of the internal clock signal and thus the falling edge of the inverted internal clock signal, first pair of the clock transistors turn on. As a result, the inverted internal output enable signal is transferred through the first pair of the clock transistors 37a,b. The commonly coupled sources of the first pair of clock transistors are coupled to an input of a first latch 39a and a drain of the first transistor 33. The first latch 39a is formed by a pair of inverters coupled together, such an input of first inverter is coupled to an output of a second inverter and the input of the second inverter is coupled to an output of the first inverter. If the internal output enable signal /OE 21b is high, a low is provided at the input of the first latch 39a. The first latch re-inverts and outputs the internal output enable signal.

The output of the first latch is coupled to a second pair of clock transistors 37c,d. The second pair of clock transistors have commonly coupled drains and sources with one transistor being a p-channel (37c) and the other being a n-channel (37d). A gate of the p-channel transistor is coupled to the internal clock signal $CLK_{13}$ ATDB and the n-channel transistor coupled to the inverted internal clock signal. At the falling edge of the internal clock signal and thus the rising edge of the inverted internal clock signal, the second pair of the clock transistors turn on. As a result, the internal output enable signal /OE is transferred through the second pair of the clock transistors 37c,d. The commonly coupled sources of the second pair of clock transistors are coupled to an input of a second latch 39b and a source of the first p-channel transistor 41. A drain of the first p-channel transistor is coupled to a reference voltage of $V_{cc}$. A gate of the p-channel transistor 41 is coupled to the inverted internal output enable signal. Thus, if the internal output enable signal is high, the first p-channel transistor 41 turns on and a path to the reference voltage is established. A high is then provided at the input of the second latch 39b. The second latch then inverts the internal output enable signal, as an output.

The internal output enable signal /OE continues, in a similar fashion, to be re-inverted through a third pair of clock transistors 37e,f and a third latch 39c and then once again inverted through a fourth pair of clock transistors 37g,h and a fourth latch 39d. The inverted internal output enable signal is then provided, as an input, to a second inverter 31b. The second inverter then re-inverts the output enable signal and thus outputs an buffered output enable signal COEB. The buffered output enable signal COEB, in one embodiment, is utilized as a system control signal. Hence, the buffered output enable signal COEB being high would signify and notify a system that data from the burst mode flash memory device is ready or valid. In this embodiment, the buffered output enable signal COEB is supplied as an input to the clock buffer circuit in FIG. 2B. The clock buffer circuit is supplied with other inputs as well.

IIA. Clock Buffer

FIG. 2B illustrates a schematic of one embodiment of the clock buffer 3 of the burst mode flash memory of the present invention shown in FIG. 1. An external clock signal CLKESDR, an external power down signal PDAD, and a stop clock signal STCLK are provided as inputs to the clock buffer. The clock buffer outputs a buffer clock signal CLKB and an internal clock signal CLK_ATDB. The internal clock signal $CLK_{13}$ ATDB depends on the external power down signal PDAD and the external clock signal CLKESDR. The external power down signal PDAD is coupled to an input of a first NOR gate 131a. The external clock signal CLKESDR is coupled to another input of the first NOR gate and an input to a first NAND gate 133a. Another input of the first NAND gate 133a is coupled to an output of a first inverter 135a. An input of the first inverter 135a supplied the external power down signal PDAD. Thus, an inverted external power down signal is provided to the first NAND gate 133a.

An output of the first NOR gate 131a is coupled to an input of a second inverter 135b. An output of the second inverter is coupled to an input of a third inverter 135c. An output of the third inverter provides the output of the internal clock signal CLKESDR. Thus, if both the external power down signal PDAD and the external clock signal CLKESDR are both low, the internal clock signal CLK_ATDB is high. However, if the external power down signal PDAD and the external clock signal CLKESDR are different, i.e. one signal being high and another being low, or are both high, the internal clock signal CLK_ATDB is low. In other words, when the external power down signal PDAD is low, the internal clock signal CLK_ATDB emulates the external clock siganl CLKESDR. However, when the external power down signal PDAD is low, the internal clock signal CLK_ATDB goes to low.

An output of the first NAND gate 133a is coupled to an input of a fourth inverter 135d. An output of the fourth inverter 135d is coupled to a gate of a first p-channel transistor 141a. The output of the first NAND gate is also coupled to a gate of a first n-channel transistor 143a. A drain of the first n-channel transistor is coupled to a source of the first p-channel transistor. A drain of the first p-channel transistor is coupled to a source of the second p-channel transistor 141b. A drain of the second p-channel transistor is coupled to a reference voltage $V_{cc}$. A source of the first n-channel transistor is coupled to a second n-channel transistor 143b. A source of the second n-channel transistor 143b is coupled to ground. Gates of both the second p-channel transistor and the second n-channel transistor are commonly coupled to an output of a second NOR gate 131b. A first input to the second NOR gate is a stop clock signal STCLK and a second input to the second NOR gate is the clock output enable signal COEB generated by the clock enable circuit (FIG. 2A).

An output of the first NAND 133a is coupled to a first input of the first OR gate 139. An output of the first OR gate 139 is supplied to a second input of a second NAND gate 133b. A first input of the second NAND gate 133b is coupled to a reference voltage $V_{cc}$. Therefore, the first input to the second NAND gate 133b is constantly high. As a result, an output of the second NAND gate 133b inverts and mirrors the state of the second input of the NAND gate 133b. For instance, if the output of the first OR gate 139, i.e., the second input of the NAND gate 133b, is low, then the output of the second NAND gate goes high. Similarly, if the output of the first OR gate 139 goes high, then the output of the second NAND gate goes low. The output of the second NAND 133b is coupled to an input of a fifth inverter 135e. An output of the fifth inverter 135e provides the output of the buffered clock signal CLKB.

A second input of a first OR gate 139 is coupled to the intersection where the output of the first loop inverter and the input of the second loop inverter meet. An output of the second loop inverter is coupled to an input of the first loop inverter. A source of the first p-channel transistor and the drain of the first n-channel transistor are both coupled to an output of a first loop inverter 137a and an input of a second loop inverter 137b.

When the stop clock signal STCLK is high, the output of the second NOR gate is low. With the output of the second NOR gate being low, the second p-channel transistor turns on and the second n-channel transistor turns off. Thus, the reference voltage is transferred through the second p-channel transistor and the second n-channel transistor creates an open circuit. At the falling edge of the internal clock signal ICLK, the first p-channel transistor turns on and thus reference voltage is passed through the first p-channel transistor. Therefore, the reference voltage is transferred to the intersection where the output of the first loop inverter 137a and the input of the second loop inverter 137b meet. Thus, the second input to the first OR gate 139 is high, i.e., supplied the reference voltage, and then the output of the first OR gate is also high, regardless of the state of the first input to the first OR gate. The second NAND gate 133b then outputs a low and the fifth inverter 135e outputs a high. Therefore, when the stop clock signal STCLK is high, the buffered clock signal CLKB is also high.

When the stop clock signal STCLK is low, the output of the second NOR gate 131b is the inverse of the clock output enable signal COEB. When the clock output enable signal COEB is low, the second n-channel transistor 143b turns on and the second p-channel transistor 141b turns off. At the rising edge of the inverted internal clock signal ICLKB, the second input of the first OR gate 139 is low. Hence, the first input of the first OR gate controls the output of the first OR gate. In other words, if the first input of the OR gate is high, then the output of the OR gate is high and similarly, if the first input of the OR gate is low, then the output of the first OR gate is also low. Since the first input to the first OR gate 139 is coupled to the inverted internal clock signal ICLKB, then the output of the first OR gate mirrors the inverted internal clock signal ICLKB. The second NAND gate 133b inverts the inverted internal clock signal ICLKB and then the fifth inverter 135e again inverts the inverted internal clock signal ICLKB. Therefore, when the stop clock signal STCLK is low and the clock output enable is low, the buffered clock signal CLKB emulates the inverse internal clock signal ICLKB.

When the clock output enable signal COEB is high and the stop clock signal STCLK is low, the second n-channel transistor 143b turns off and the second p-channel transistor 141b turns on. At the falling edge of the internal clock signal ICLK, the second input of the first OR gate 139 is high. Hence, with the second input of the first OR gate 139 being high, the output of the first OR gate is also high. The second NAND gate 133b then outputs a low and the fifth inverter 135e outputs a high. Therefore, when the stop clock signal STCLK is high and the clock output enable is high, the buffered clock signal CLKB is also high.

Figure 2C:
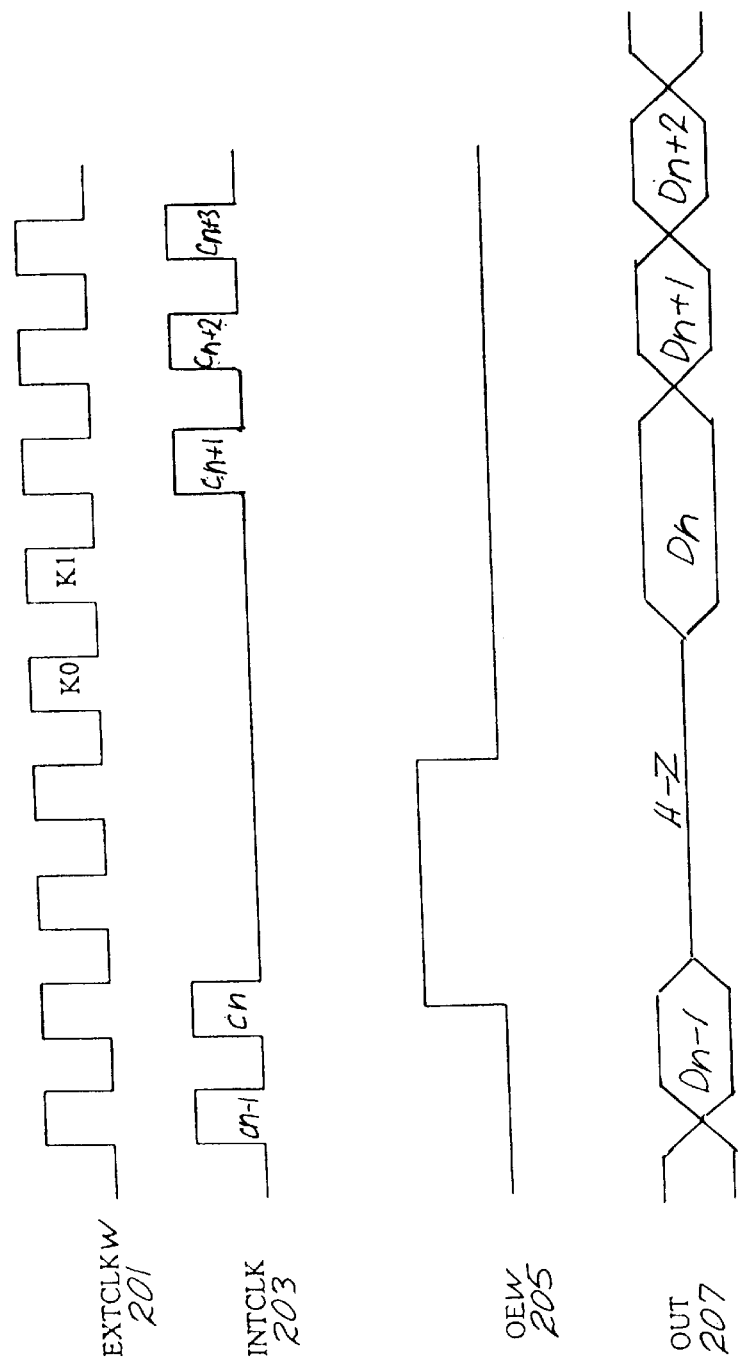
FIG. 2C illustrates a timing diagram of signals for the clock buffer of FIGS. 1, 2A and 2B.

FIG. 2C illustrates a timing diagram that provides the relationships between signals to describe the operation of the clock buffer described above in reference to FIGS. 1, 2A and 2B. An external clock waveform EXTCLKW 201 represents the external clock signal CLKESDR being supplied to the generator buffer 3 (FIG. 2B) over time. The external clock waveform EXTCLKW 201 is a periodic signal with an amplitude ranging from 0 volts to a reference voltage $V_{cc}$. An internal clock waveform INTCLK 203 represents an inverted buffered clock signal CLKB being outputted from the buffered clock generator over time. The internal clock waveform INTCLK 203 also has an amplitude ranging from 0 volts to $V_{cc}$. The internal output enable signal /OE 216 being supplied to the burst suspend 121 (FIG. 2A) over time is represented by the output enable waveform /OEW 205. While the output enable waveform is low, i.e., zero volts, the clock buffer and the burst suspend is on.

In other words, when the output enable waveform /OEW 205 is low, the buffered output enable signal COEB (FIG. 1) is low. With the buffered output enable signal COEB being low, as described above in reference to FIG. 2B, the inverted buffered clock signal CLKB emulates the external clock signal CLKESDR. Thus, the internal clock waveform INTCLKW 203 mirrors the external clock waveform EXTCLKW 201. As previously, described in reference to FIG. 1, the inverted buffered clock signal CLKB is supplied to the address buffers 7. The address buffers, synchronously with the rising edge of the inverted buffered clock signal CLKB, supplies the address signals $A_0$–$A_N$ to the decoder 9 and the data counter 13. The decoder 9 selects the memory cells from the core cell array 11 and the sense amplifiers 15a–d fetch the data from the selected memory cells. The data counter 13 selects the latch buffers 17a–d to temporarily store the data to be outputted to the output buffer 19. The output waveform OUT 207 represents data outputted from the output buffer 19. Thus, when the internal output enable signal /OE is low, data is outputted from the output buffer 19.

As the output enable waveform /OEW 205 shows, when the output enable signal /OE1 goes high, the internal clock waveform 203 does not emulate the external clock waveform 201. As previously described in reference to FIG. 2A, when the internal output enable signal /OE goes high, the buffered output enable signal COEB goes high. With the buffered output enable signal COEB being high, as described above in reference to FIG. 2B, the inverted buffered clock signal CLKB goes low, regardless of the state of the external clock signal CLKESDR. Thus, the inverted buffered clock signal CLKB supplied to the address buffers 7 is low and address signals $A_0$–$A_N$ are not supplied to the rest of the flash memory.

As the output enable waveform /OEW 205 shows at a later time, when the internal output enable signal /OE again goes low, the internal clock waveform 203 again starts to emulate the external clock waveform 201. As previously described in reference to FIG. 2A, when the internal output enable signal /OE goes high, the buffered output enable signal COEB goes high. However, for the output enable signal /OE to propagate through the burst suspend (FIG. 2A), two clock periods $K_0$ and $K_1$ are required. Therefore, as shown by the external clock waveform EXTCLK 201 and the output enable waveform /OEW 205, the internal clock waveform INTCLKW emulates the external clock waveform EXTCLK after the two clock periods $K_0$ and $K_1$. Referring back to FIG. 1, the delay of two clock periods of the buffered clock signal CLKB, allows the temporary data $D_n$ in either one of the latch buffers 17a–17d additional time to stabilize. The temporary data $D_n$ is associated with the previous clock period $C_n$ just prior to the internal output enable signal /OE going high. The delay ensures that data is ready and valid and outputted through the output buffer 19.

III. Initial Latency with Handshake Mode

Figure 3:
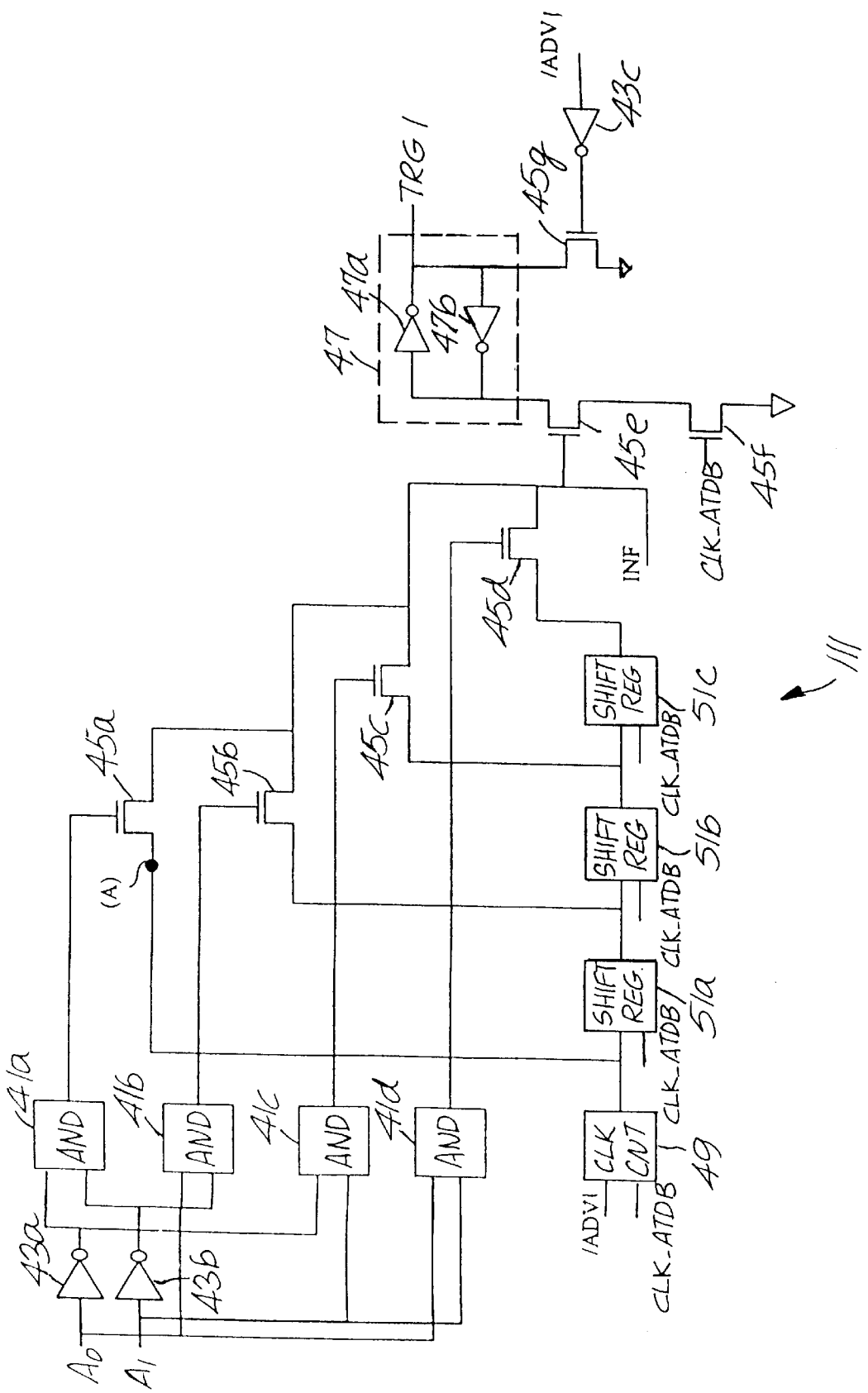
FIG. 3 illustrates a circuit semi-schematic of a handshake mode circuit of the flash memory device of FIG. 1.

FIG. 3 illustrates a schematic of one embodiment of the handshake mode of the burst mode flash memory of the present invention. Based on the initial address bits $A_0$ and $A_1$, a counter circuit 49 counts the number of clock periods of the internal clock signal CLK-ATDB (FIG. 1). The decoder circuit then generates a trigger signal TRG 1 that is provided to an internal clock generator illustrated in FIG. 4.

The handshake mode 111 is provided address information from the address buffers 3 and includes a series of logic gates including AND gates and inverters. Address information, specifically address bit $A_0$, is coupled to a second AND gate 41b and a fourth AND gate 41d. Address bit $A_0$ is also coupled to a first inverter 43a. An output of the first inverter is coupled to a first AND gate 41a and a third AND gate 41c. Likewise, Address bit $A_1$ is coupled to an input of a first AND gate 41a and an input of a fourth AND gate 41d. Address bit $A_1$ is also coupled to a second inverter 43b. An output of the second inverter is coupled to the first AND gate 41a and the second AND gate 41b.

Outputs of the first, second, third and fourth AND gates 41a–d are coupled respectively to a gate of a first, second, third and fourth transfer transistor 45a–d. Each transfer transistor 45a–d has a gate, a source and a drain. If an active high is provided to the gate of a transfer transistor, the transfer transistor turns on. In other words, the input or signal provided to the source of the transfer transistor is transferred to the drain of the transfer transistor. However, if an active low is provided to the gate of a transfer transistor, the transfer transistor turns off and thus no signal is provided from the source to the drain of the transfer transistor. Accordingly, the condition or logic state of the address bits $A_0$ and $A_1$ determines or controls which transfer transistor 45a–d turns on and which transfer transistor turns off. Table 1 summarizes the relationship between the address bits $A_0$ and $A_1$ to the transfer transistors 45a–d. As Table 1 shows, only one of the four transfers transistors 45a–d is on at one time, while the remaining three transfer transistors are off.

TABLE 1

| A0 | A1 | 45a | 45b | 45c | 45d |
|----|----|-----|-----|-----|-----|
| 0 | 0 | ON | OFF | OFF | OFF |
| 1 | 0 | OFF | ON | OFF | OFF |
| 0 | 1 | OFF | OFF | ON | OFF |
| 1 | 1 | OFF | OFF | OFF | ON |

The drain of the first, second, third and fourth transfer transistors are commonly coupled to the gate of a fifth transfer transistor 45e. The source of fifth transfer transistor 45e is coupled to the drain of the sixth transfer transistor 45f. The source of the sixth transfer transistor is coupled to a common or ground. The gate of the sixth transfer transistor is coupled to the internal clock signal CLK-ATDB (FIG. 1). Thus, the sixth transfer transistor turns on and off, synchronously with the internal clock signal CLK_ATDB. For instance, when the internal clock signal goes high, the transistor turns on and when the internal clock signal goes low, the transistor turns off.

The drain of the fifth transfer transistor 45e is coupled to a latch 47 that includes a first latch inverter 47a and a second latch inverter 47b. Both latch inverters 47a,b have an input and an output. The input of the first latch inverter is coupled to the output of the second latch inverter. Similarly, the input of the second latch inverter is coupled to the output of the first latch inverter. The input to the first latch inverter and thus, also the output of the second latch inverter is coupled to a drain of the fifth transfer transistor 45e. The input to the second latch inverter and thus, also the output of the first latch inverter supplies the trigger signal TRG1. Also, the input of the second latch inverter is coupled to a drain of the seventh transfer transistor 45g. The source of the seventh transfer transistor is coupled to a common or ground. The gate of the seventh transfer transistor is coupled to an output of a third inverter 43c, whose input is coupled to the address advance signal /ADV. Thus, when the address advance signal /ADV goes low, the seventh transfer transistor 45g turns on and when the address advance signal /ADV1 goes high, the seventh transfer transistor turns off.

When the seventh transfer transistor turns on, a path to ground is provided to the trigger signal TRG1. Therefore, the trigger signal TRG1 is pulled to ground, i.e., a low. Conversely, when the seventh transfer transistor 45g turns on, a path to ground is not provided to the trigger signal TRG1. Therefore, the trigger signal TRG1 is permitted to "float" to the voltage level or state of the output of the first latch inverter 47a.

The source of the first transfer transistor 45a is coupled to an output of a clock counter circuit 49. The source of the second transfer transistor 45b is coupled to an output of a first shift register 51a. The source of the third transfer transistor 45c is coupled to an output of the second shift register 51b. The source of the fourth transfer transistor 45d is coupled to an output of the third shift register 51c. The internal clock signal CLK_ATDB is provided as an input to each shift register 51*1*–51c and the clock counter circuit 49. An address advance signal /ADV is provided as an input to the clock counter circuit 49. The address advance signal /ADV1 acts as a reset to restart the clock counter circuit 49.

The clock counter circuit 49 counts the number of "clocks" or clock periods generated by the internal clock signal CLK_ATDB. In other words, in one embodiment, when the address advance signal /ADV goes high, the clock counter circuit 49 initiates a counter to track the number of clock periods generated by the internal clock signal. Upon each rising edge of the internal clock signal, the counter in the clock counter circuit 49 increments and an active low is outputted from the clock counter circuit 49. When the counter "counts" up to a three, i.e., three clock periods generated by the clock signal CLK1 has been tracked, the counter causes the clock counter circuit to produce an active high output. Therefore, at the rising edge of the third "clock" from the clock signal CLK1, the source of the first transfer transistor 45a also transitions to an active high.

As noted above, in reference to Table 1, if the initial address is directed to latch buffer 17a (i.e., $A_0$="0", $A_1$="0"), then the gate of the first transfer transistor 45a would go high, i.e., turns on. Since, the source of the first transfer transistor 45a is also high, the gate of the fifth transfer transistor 45e also transitions to an active high and the fifth transfer transistor turns on. When the next "clock" (the fourth clock) from the internal clock signal is generated, the sixth transfer transistor 45f turns on. A path from the input of the first latch inverter 47a through the fifth and sixth transfer transistors 45e and 45f to ground is then established. Hence, the input to the first latch inverter 47a is pulled to ground or low. The first latch inverter then inverts its input to produce an active high on trigger signal TRG1. The trigger signal TRG1 is supplied to an internal clock generator. The internal clock generator, in one embodiment, replaces the clock buffer 3 (FIG. 1). In another embodiment, the internal clock generator supplements the clock buffer 3.

IIIA. Internal Clock Generator

Figure 4:
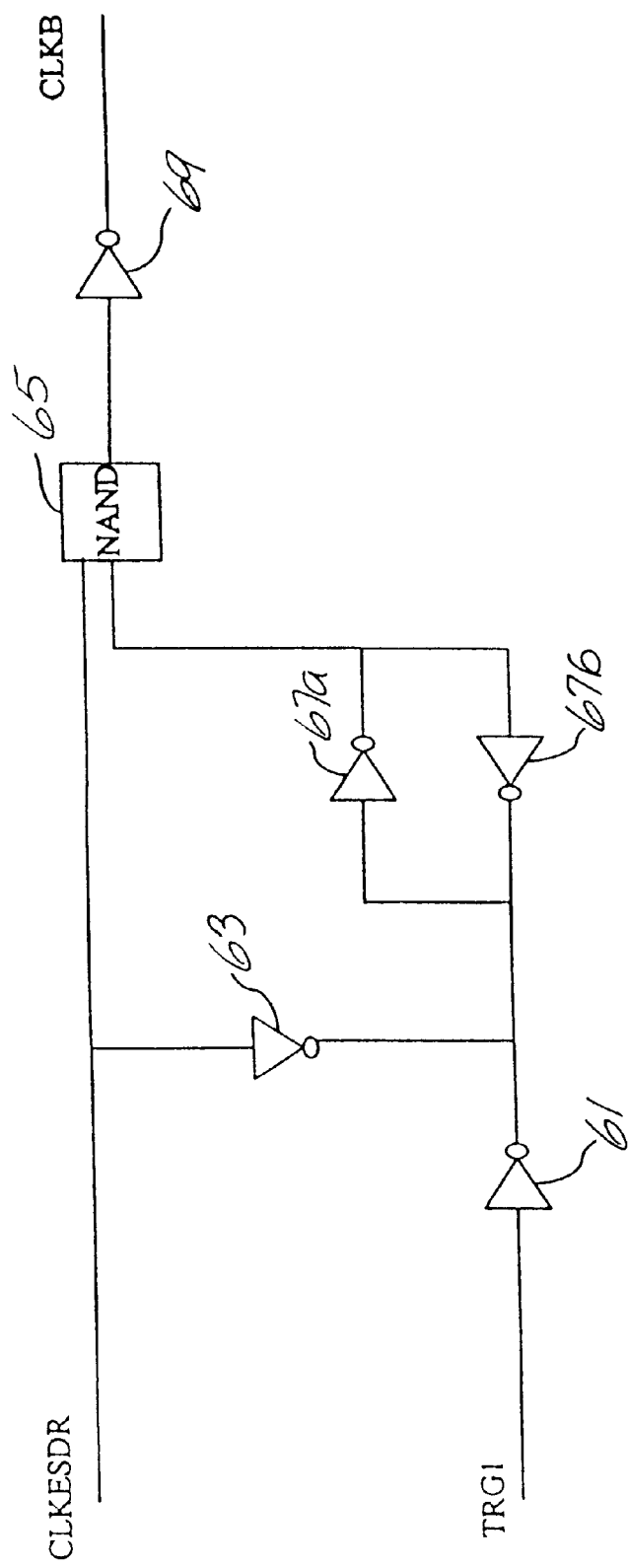
FIG. 4 illustrates a circuit semi-schematic of an internal clock generator of the flash memory device of FIG. 1.

FIG. 4 illustrates a schematic of one embodiment of the internal clock generator of the present invention. The trigger signal TRG1 is coupled to a first input of an internal clock generator. The external clock signal CLKESDR is coupled to a second input of the internal clock generator. The first input is coupled to a first input inverter 61. The second input is coupled a second input inverter 63 and a first NAND gate 65. Output of the second input inverter 63 is commonly coupled to an output of the first input inverter 61 which are both coupled to an input of the first latch inverter 67a and an input of the second latch inverter 67b. The output of the first latch inverter and the input of the second latch inverter are coupled to the first NAND gate 65. The output of the first NAND gate is coupled to input of the third inverter 69. The output of the third inverter outputs the buffered clock signal CLKB. Thus, the buffered clock signal CLKB only transitions to a high, when both the external clock signal CLKESDR and the trigger signal TRG1 are high. When either the external clock signal CLKESDR, the trigger signal TRG1 or both are low, the buffered clock signal CLKB is also low.

Therefore, using the external clock signal and the trigger signal, the internal clock generator generates a buffered clock signal. The buffered clock signal is in sync with the external clock signal. The buffered clock signal is supplied to the address buffers as described previously in reference to FIG. 1. The address buffer generates the address information to provide the decoder to select specific memory cells and for the sense amplifiers to read the data from the selected memory cell.

Figure 4A:
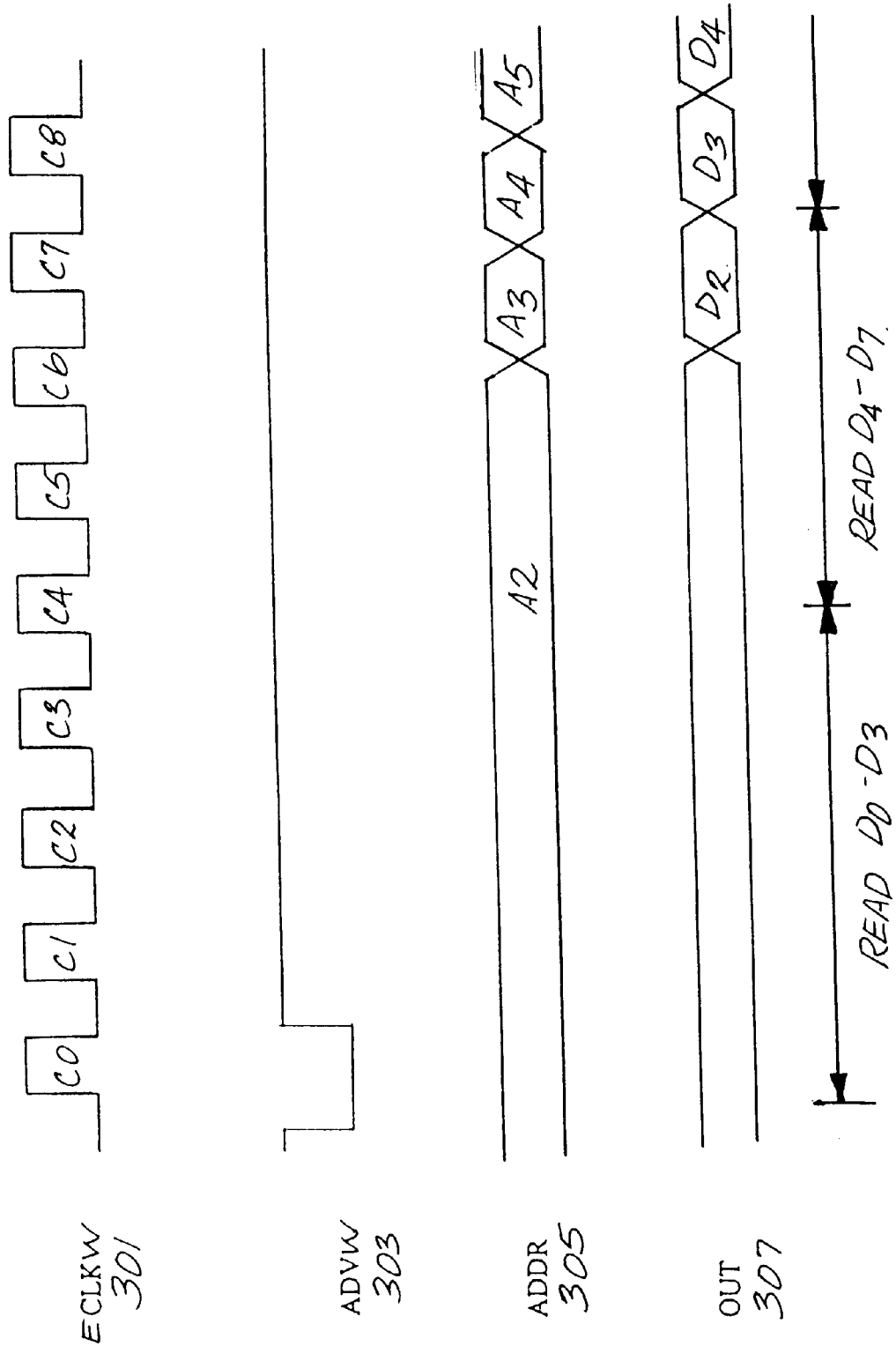
FIG. 4A illustrates a timing diagram of signals for the internal clock signal generator of FIG. 4.

FIG. 4A illustrates a timing diagram providing the relationships between signals to describe the operation of the internal clock signal generator described above in reference to FIG. 4. An external clock waveform EXTCLKW 301 represents the external clock signal CLKESDR being supplied to the internal clock generator (FIG. 4) over time. The external clock waveform EXTCLKW 301 is a periodic signal with an amplitude ranging from 0 volts to a reference voltage $V_{cc}$. An address advance waveform /ADVW 303 represents the address advance signal /ADV being supplied to the clock counter 49 (FIG. 3) over time. The address advance waveform /ADV going low represents the address advance signal /ADV resetting the clock counter. Referring to FIG. 1 and FIG. 4A, the address waveform 305 represents the address signals $A_0$–$A_N$ supplied to the address buffer 7. In the embodiment described, the initial address signals $A_0$–$A_N$ supplied point to the address $A_2$. As described in reference to FIG. 3, the third AND gate 41c outputs a high and turns on the third transistor 45c.

Referring to FIGS. 3, 4 and 4A, clock periods C1–C3 pass before a high is supplied to the gate of the fifth transistor 45e. Upon a rising edge of clock period C4, the sixth transistor 45f causes the trigger signal TRG1 to go high. When the trigger signal TRG1 goes high, upon a rising edge of clock period C5, the first NAND gate 65, generates the buffered clock signal CLKB. Referring to FIG. 1, the buffered clock signal CLKB is supplied to the address buffer 7. The address buffer supplies address signal $A_3$, the next address signal, to the decoder 9 and the data counter 13. Thus, data fetched and temporarily stored in the latch buffer 17c, is transferred to the output buffer 19. As such, at a rising edge of clock period C6, data D2 associated with the address signal A2 is outputted from the output buffer 19. Without manipulation of the buffered clock signal CLKB, given an initial address, for example, of address A2, an additional six clock periods are required before data is outputted.

IIIB. Extra Internal Clock Generator

Figure 5:
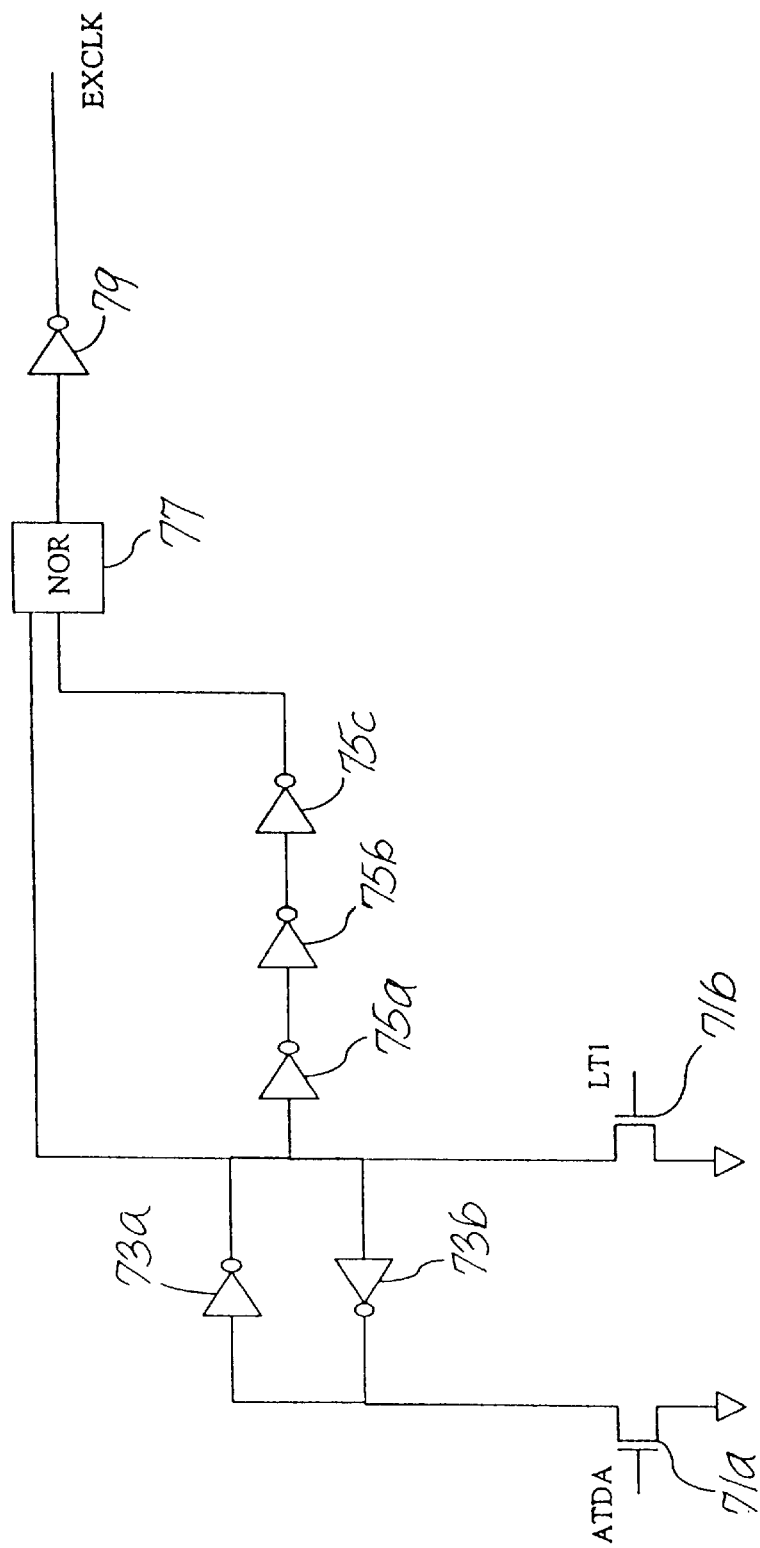
FIG. 5 illustrates a circuit semi-schematic of an extra internal clock generator of the flash memory device of FIG. 1.

In one embodiment, a first clock of the buffered clock signal CLKB is provided by an extra internal clock generator after the first 4 initial clock periods of the external clock signal CLKESDR. By providing the extra internal clock, data is outputted quicker by triggering the output of data "out of turn". FIG. 5 illustrates a schematic of one embodiment of an extra internal clock generator. A gate of a first transfer transistor 71a is coupled to an input line containing the address transition detection signal ATD (FIG. 1). A gate of a second transfer transistor 71b is coupled to an input line containing the latch active signal LT1. Both sources of the first transfer transistor 71a and the second transfer transistor 71b are coupled to ground. Therefore, when both the latch active signal LT1 and address transition detection signal ATD go high, the first and second transfer transistors establish a path to ground. A drain of the first transfer transistor 71a is coupled to an input of a first latch inverter 73a. An output of a second latch inverter 73b is also coupled to the source of the first transfer transistor 71a. An output of the first latch inverter 73a and an input of the second latch inverter 73b are similarly coupled to a drain of the second transfer transistor 71b, to a first NOR gate 77, and a first delay inverter 75a. Output of the first delay inverter is coupled to a second delay inverter 75b. Similarly, output of the second delay inverter is coupled to a third delay inverter 75c. Output of the third delay inverter is coupled to the first NOR gate 77. Output of the first NOR gate 77 is coupled to an input of an output inverter 79. Output of the output inverter is coupled to an output line that contains the extra internal clock signal EXCLK1.

The rising edge of the extra internal clock signal EXCLK1 causes the decoder counter selector 13 (FIG. 1) to enable a latch buffer 17a–d. Thus, an "OR" operation is performed to combine the extra internal clock signal EXXCLK1 to the buffered clock signal CLKB. The data in the latch circuit is then subsequently transmitted to the output buffer 19 and thereby outputted from the burst mode flash memory. In one embodiment, when the rising edge of the extra internal clock signal EXCLK1 occurs, the data in a latch appears shortly or immediately after the initial setup clocks. In other embodiments, data appearing immediately after the initial setup clocks is not preferred and thus a bypass signal INF is utilized to disable this feature. The bypass signal INF is described more fully below in reference the power down detector shown in FIG. 6.

Figure 5A:
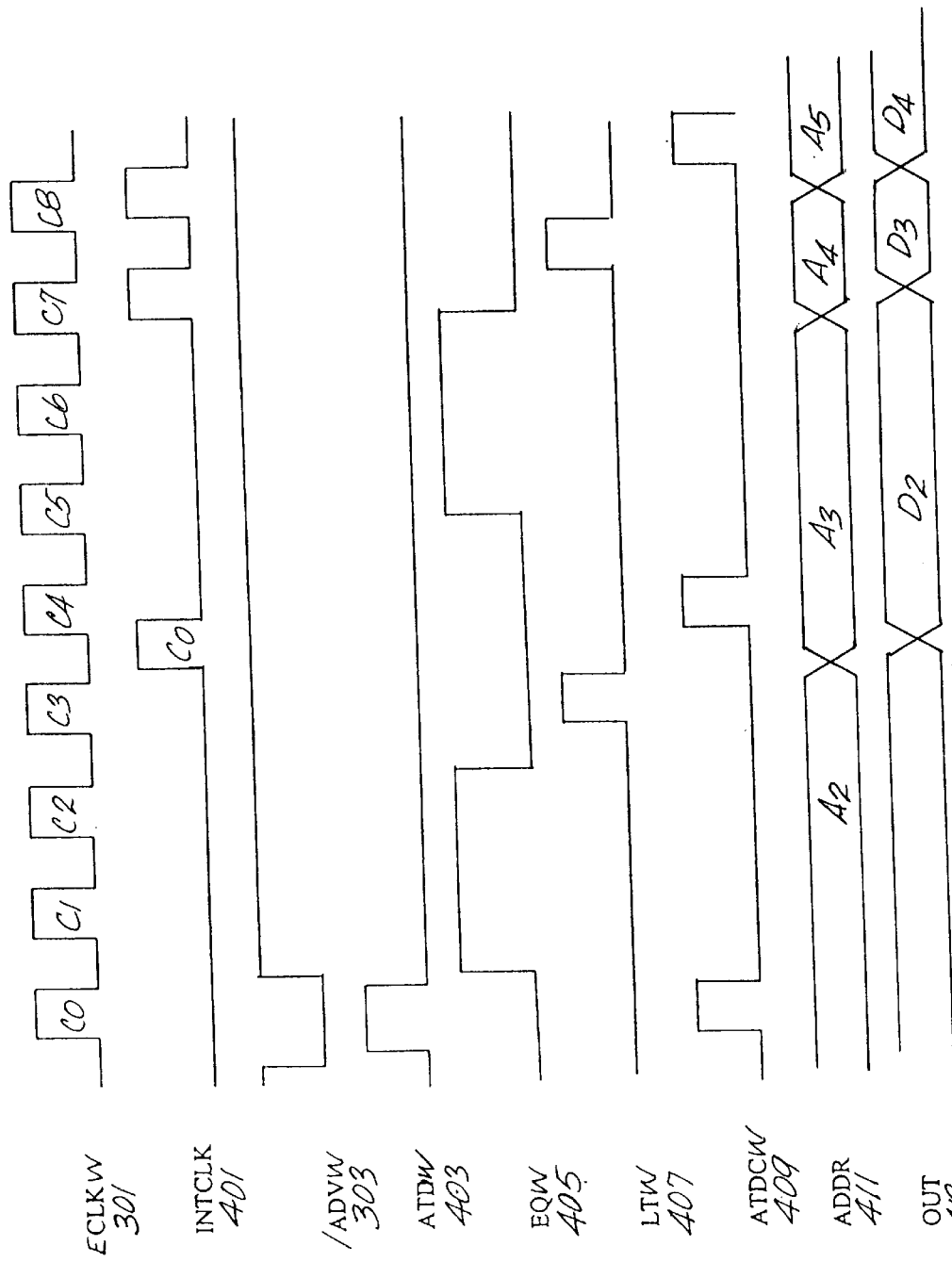
FIG. 5A illustrates a timing diagram of signals of the extra internal clock signal generator of FIG. 5.

FIG. 5A illustrates a timing diagram providing the relationships between signals to describe the operation of the extra internal clock signal generator described above in reference to FIG. 5. The external clock waveform ECLKW 301 and the address advance waveform /ADVW 303 are identical to the waveforms illustrated in FIG. 4A and are shown in FIG. 5A for clarity. An address transition waveform ATDW 403 represents the address transition signal ATD that is generated by the address transition detector 141 (FIG. 1) over time. At a falling edge of the address advance waveform /ADV 303, the address transition signal ATD goes high. A sense amplifier control signal EQ is generated by the sense amplifiers 15a–d. The sense amplifier control signal EQ signifies that data fetched by the sense amplifiers 15a–d are ready to be transferred to the latch buffers 17a–d. A falling edge of the address transition waveform ATD causes the sense amplifier signal EQ to go high, as shown by sense amplifier control waveform EQW 405 going high. At a falling edge of the sense amplifier control waveform EQW, a latch control waveform LT goes high. The latch control waveform LTW represents the latch control signal LTC generated by one of the latch buffers 17a–17d to signify that data is ready to be outputted.

The buffered clock waveform INTCLK 401 represents the buffered clock signal CLKB (FIG. 4) with the addition of the extra clock signal EXCLK generated by the extra internal clock generator (FIG. 5). As such, a clock period $C_0$ in the buffered clock waveform INTCLK 401 represents the extra clock signal supplied by the extra clock generator. The extra clock generated, i.e., clock period $C_0$, causes the output buffer 19 to output the data $D_2$. Specifically, the extra clock causes the address buffer to provide address signal $A_3$ to the decoder 9 and the data control 13. Therefore, data $D_2$ temporarily stored in the latch buffer 17c is transferred to the output buffer 19 (FIG. 1). The output buffer 19 then outputs the data $D_2$. Therefore, in comparison to the timing diagram illustrated in FIG. 4A, the output of data occurs immediately after a fourth clock period C4, instead of clock period C6. Hence, data is ready or provided from the flash memory quicker and shortly after an initial read operation of the data $D_0$ to $D_3$.

The burst address transition waveform ATDCW 409 resembles the address transition signal ATDA but is generated after every four clock periods. A falling edge of the burst address transition waveform causes the sense amplifier control waveform EQW to go high. As mentioned above, the latch control signal LT1 generated by the latch buffers 17a–17d to signify that data is ready to be outputted. Thus, at the following clock period shown in the buffered clock waveform INTCLK 401, the output buffer 19 outputs data $D_3$. Similarly, upon each successive clock periods in the internal clock waveform INTCLK 401, the output buffer 19 successively outputs data, e.g. data $D_4$, data $D_5$, and so on.

IV. Power Down Detector

Figure 6:
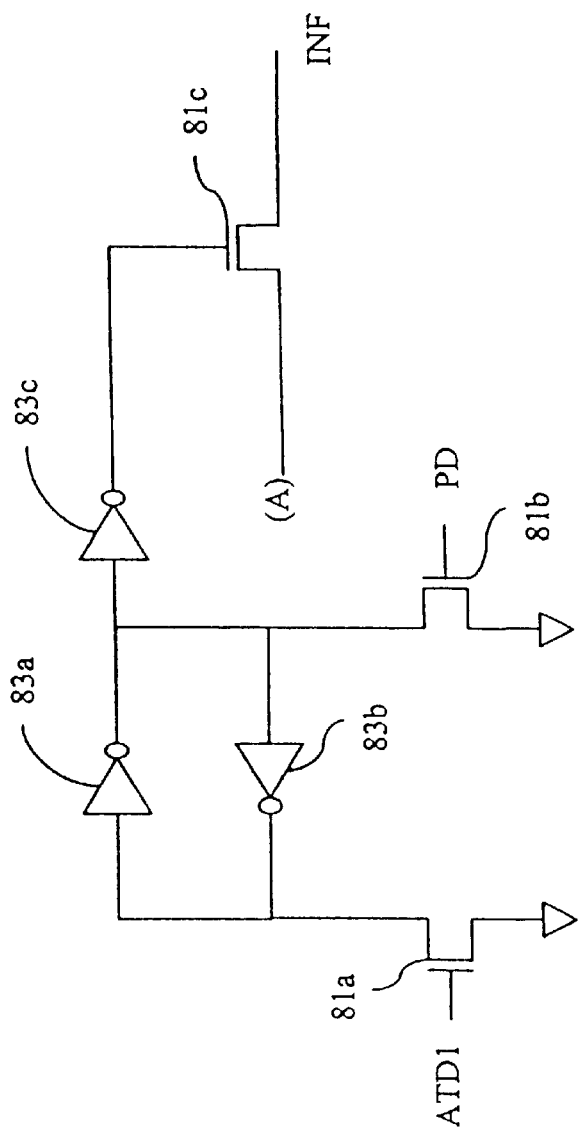
FIG. 6 illustrates a circuit semi-schematic of a power down detector of the flash memory device of FIG. 1.

FIG. 6 illustrates a schematic of one embodiment of a power down detector of the present invention. The power down detector generates the bypass signal INF to the handshake mode 111 described above in reference to FIG. 3. The power down detector includes three inverters 83a–c and three transfer transistors 81a–c. A gate of the first transfer transistor 81a is coupled to an address transition detection signal ATD (FIG. 1). As previously mentioned, the address transition detection signal ATD is provided by an address transition detector 141. A source of the first transfer transistor 81a is coupled to ground. A drain of the first transfer transistor is coupled to a latch formed by a first latch inverter 83a and a second latch inverter 83b. The latch provides a loop that helps to maintain the voltage level of a signal provided at an input or an output of the latch. Specifically, the drain of the first transfer transistor 81a is coupled to an input of the first latch inverter 83a and an output of the second latch inverter 83b, i.e., the input of the latch.

When the address transition detection signal ATD is high, the first transfer transistor provides a path to ground. Thus, the input to the latch is also pulled down to ground, i.e., a logic zero. The first latch inverter 83a inverts the input to the latch to generate a logic one at an output of the latch. The output of the latch is a connection where an output of the first latch inverter 83a, an input of the second latch inverter 83b and a drain of a second transfer transistor 81b intersect. An input of a third inverter 83c receives the output of the latch and inverts the logic one back to a logic zero. Therefore, a logic one is present to a gate of a third transfer transistor 83c and thereby turns off the third transfer transistor. As a result, no signal is provided through the third transfer transistor, i.e., from a drain of the third transfer transistor to a source of the third transfer transistor. In other words, an open circuit is formed and no bypass signal INF is generated. Thus, with no bypass signal INF being generated, the operation of the counter circuit is not affected.

However, when the address transition detection signal ATD is low, the first transfer transistor 81a is turned off. Therefore, an open circuit is formed at the input of the latch. A source of the second transfer transistor 81b is coupled to ground and a gate of the second transfer transistor 81b is coupled to a power down signal PD.

The power down signal PD is generated by a OR logic operation (not shown). The OR logic operation has, as inputs, the sense amplifier control signal EQ (FIG. 5A), a latch control signal LTC (FIG. 5A) and the address transition detection signal ATD. The sense amplifier control signal EQ signifies that a sense amplifier has detected or read data from a selected memory cell and the data is ready to be transferred to a latch circuit.

When the power down signal PD is high, the second transfer transistor 81b turns on and a path to ground is established. Hence, the output of the latch is pulled down to ground, i.e., a logic zero. The third inverter 83c inverts the logic zero to present a high or logic one to the gate of the third transfer transistor 81c, turning the third transfer transistor on. With the third transfer transistor on, a path is established from the drain of the third transfer transistor to the source of the third transfer transistor. The drain of the third transfer transistor 81c is connected to the output of the clock counter 49, previously described in reference to FIG. 3. Therefore, the output of the clock counter 49 is provided to the source of the third transfer transistor and thus the bypass signal INF.

Referring back to FIG. 3, with the bypass signal INF being directly coupled to the gate of the fifth transfer transistor 45e, the first, second, third and fourth transfer transistors 45a–d are bypassed. Instead of the condition, i.e., turning on or off, of the first, second, third or fourth transfer transistors, controlling when the trigger signal TRG is to be generated, the bypass signal INF controls the trigger signal TRG1. Thus, when the bypass signal INF goes high the trigger signal TRG1 also goes high. Therefore, by providing the INF signal to counter circuit the handshake mode feature is disabled.

Figure 6A:
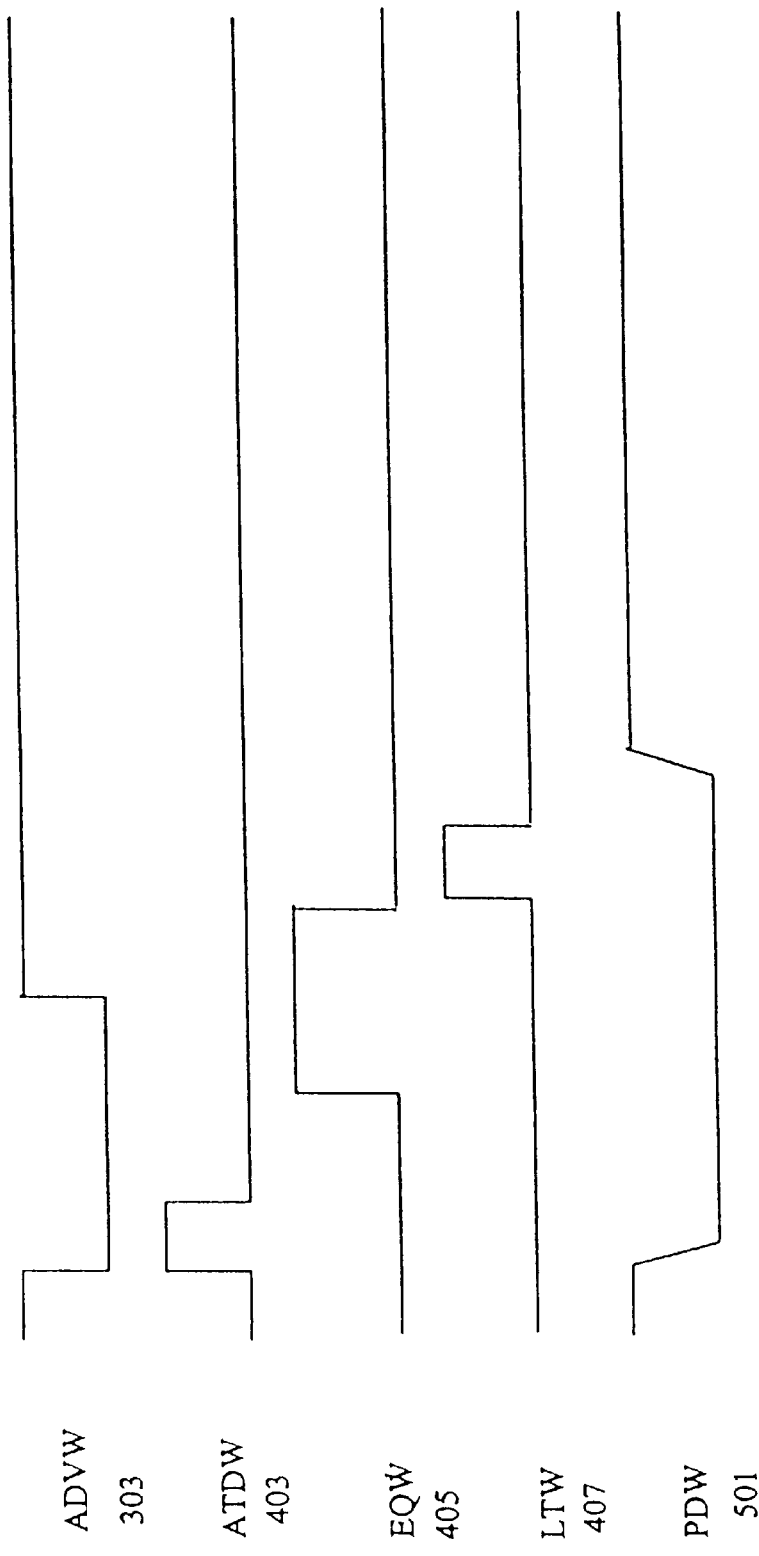
FIG. 6A illustrates a timing diagram of signals for the power down detector of FIG. 6.

FIG. 6A illustrate timing diagrams that provide the relationships between signals to describe the operation of the power down detector described above in reference to FIG. 6. The address advance waveform /ADVW 303, the address transition waveform ATDW 403, the sense amplifier control waveform EQW 405, and the latch control waveform LTW 407 are identical to the waveforms illustrated in FIG. 5A and are shown for completeness. A power down waveform PDW 501 is shown and represents the power down signal PD provided to the second transistor 81b in FIG. 6. An initial clock CO is generated by the clock buffer 3 (FIG. 1) the internal clock signal 51 appears. If an initial clock 503a appears when the power down signal PD is low, then the handshake mode feature does not need to be turned off. Upon the falling edge of the latch control signal LTC, the address transition signal ATD goes high. Therefore, the third transistor 81c in FIG. 6, does not turn on and thus the bypass signal INF is left open.

Also, when an initial clock is generated, the address transition signal ATD goes high. Hence, even after the power down signal PD goes high, the handshake mode is not turned off, since the third transistor 81c (FIG. 6) does not turn on. However, if the address transition signal ATD does not go high, before the power down signal goes high to turn on the third transistor 81c, then the handshake mode feature turns off. Likewise, if the initial clock is not generated before the power down signal PD goes high to turn on the third transistor 81c, the handshake mode feature is turned off. Therefore, if the initial clock or the address transition signal ATD is not generated in time to prevent the power down signal to turn on the third transistor 81c, then the clock frequency of the external clock signal 81 is too slow. Too slow refers to the fact that reducing the initial latency time provided by a burst mode transfer would not increase the performance of the flash memory.

IV. Output Buffer Circuit

Figure 7:
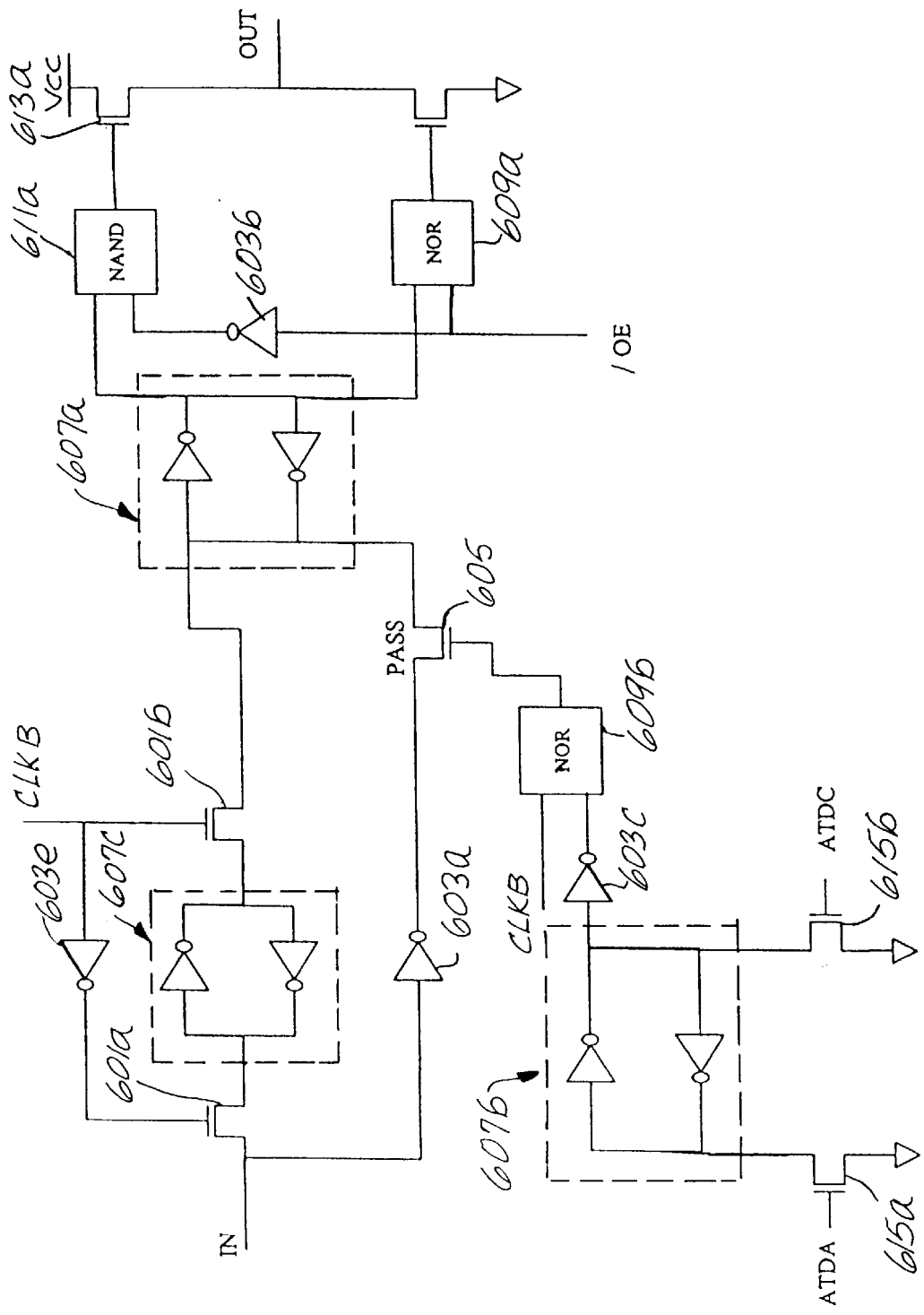
FIG. 7 illustrates a circuit semi-schematic of an output buffer of the flash memory device of FIG. 1.

FIG. 7 illustrates a schematic of one embodiment of the output buffer of the present invention. In one embodiment, the output buffer replaces the output buffer 19 in FIG. 1. The output buffer receives as inputs an address detection signal ATDA, a burst address detection signal ATDC, an output enable signal /OE and the buffered clock signal CLKB. The output buffer also receives as an input the data from one of the latch buffers 17a–17d. The data from the latch buffers are provided to a drain of a third transfer transistor 601a and an input to an first inverter 603a. Output of the first inverter is coupled to a bypass transistor 605. A source of the bypass transistor 605 is coupled to a input of a first latch 607a. Output of the first latch is coupled to an input of a first NOR gate 609a ONOR1 and an input of a first NAND gate 611a. The other input of the first NOR gate is coupled to the output enable signal /OE. The other input of the first NAND gate 611a is coupled to a second inverter 603b that receives the output enable signal /OE as an input. When the output enable signal /OE is high, the first NAND gate 611a also generates an output of a logic one. The output of the first NAND gate is coupled to a gate of a first out transistor 613a. A drain of the first out transistor is coupled to a reference voltage and a source of the first out transistor provides a connection for an output signal OUT. The output signal OUT being the output from the burst mode flash memory device (FIG. 1).

Referring back to the bypass transistor 605, a gate of the bypass transistor is coupled to an output of a second NOR gate 609b. The second NOR gate receives an external clock signal and an output from a third inverter 603c, as inputs. An input of the third inverter is coupled to an output of a second latch 607b. An input of the second latch is coupled to a drain of a first transfer transistor 615a. A gate of the first transfer transistor is coupled to an address transition detection signal ATDA and a source of the first transfer transistor is coupled to a ground. When the address transition detection signal ATDA goes high, the first transfer transistor goes on, and pulls the input of the second latch 607 down to ground. The output of the second latch goes high and is inverted by a third inverter 603c. At the falling edge of the buffered clock signal CLKB, the output of the second NOR gate 609b outputs a high and thus the bypass transistor 605 turns on. As previously described above, with the bypass transistor turned on, any data present at the input of the output buffer is outputted, when the output enable signal /OE goes low.

A gate of a second transfer transistor 615b is coupled to a burst address transition detection signal ATDC and a source of the second transfer transistor is coupled to ground. Similar to the address transition detection signal ATDA, when the burst address transition detection signal ATDC goes high, the second transfer transistor turns on. The output of the second latch is then pulled to ground and the output is inverted by the third inverter 603c. At the rising edge of the buffered clock signal CLKB, the output of the second NOR gate 609b outputs a high and thus the bypass transistor 605 turns on. Therefore, as previously described above, with the bypass transistor turned on, any data present at the input of the output buffer is outputted, when the output enable signal /OE goes low.

A source of the third transfer transistor 601a is coupled to an input of a third latch 607c. Output of the third latch is coupled to a drain of a fourth transfer transistor 601b. A gate of the first transfer transistor is coupled to a fifth inverter 603e that is coupled to the buffered clock signal CLKB. A gate of the fourth transfer transistor is coupled to the external clock signal. At the falling edge of the buffered clock signal, the gate of the first transfer transistor turns on. Data at the input of the output buffer is transferred through the first transfer transistor. The third latch 607c inverts the data. At the rising edge of the buffered clock signal, the fourth transfer transistor 601b turns on. The inverted data at the output of the third latch is then transferred through the fourth transfer transistor 601b is provided to the input of the first latch s607a. The first latch re-inverts the data and provides the data to the first NAND gate 611a and the first NOR gate 609a. When the output enable signal is low, the data is then outputted through the output signal OUT.

V. Decoder Counter Selector

Figure 8:
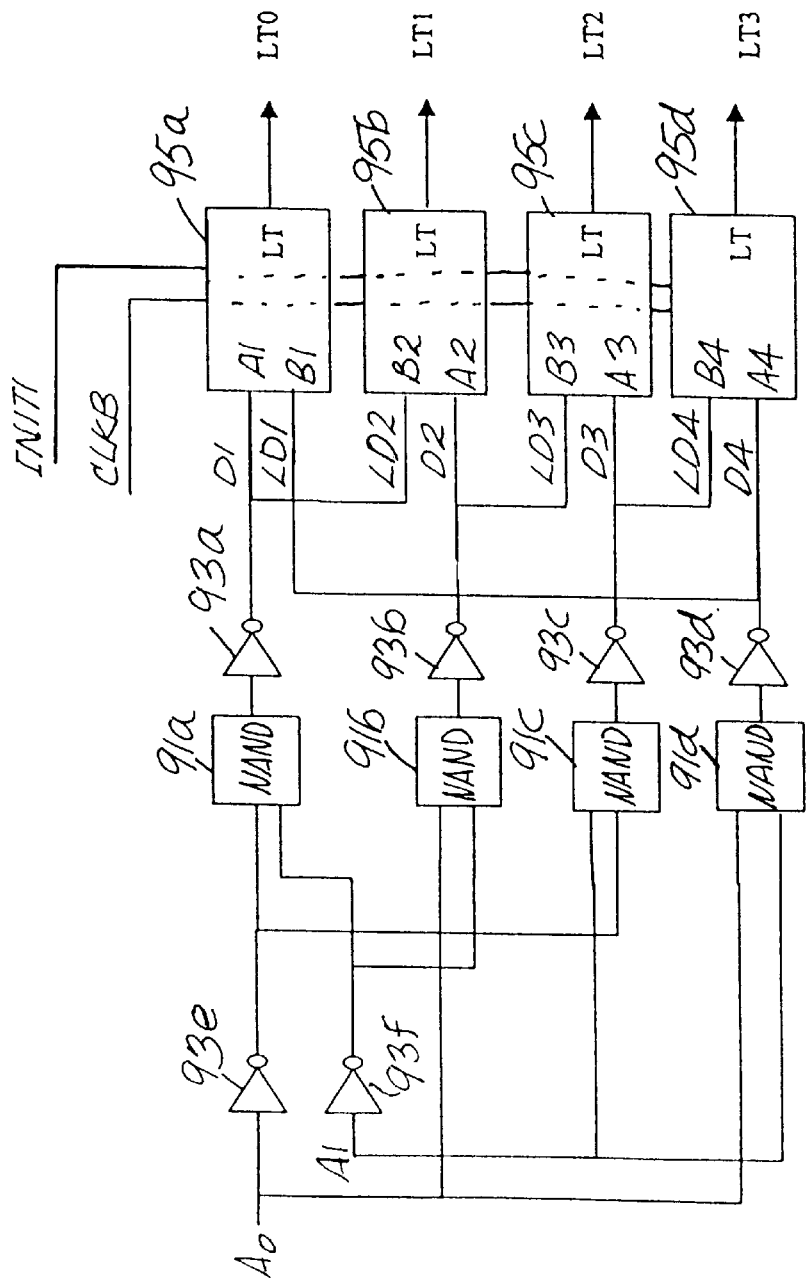
FIG. 8 illustrates a circuit semi-schematic of a decoder counter selector of the flash memory device of FIG. 1;1

FIG. 8 illustrates a schematic of one embodiment of the decoder counter selector of the burst mode flash memory of the present invention. The decoder counter selector includes four NAND gates 91a–c, six inverters 93a–f, and four shift registers 95a–d. The decoder counter selector receives as inputs address signal $A_0$–$A_1$ (first two bits of the address signal $A_0$–$A_N$). The address signal $A_0$ is coupled to a fifth inverter 93e and address signal $A_1$ is coupled to a sixth inverter 93f. An output of the fifth inverter is coupled to an input of the first NAND gate 91a and an input of the third NAND gate 91c. An output of the sixth inverter 93f is coupled to the first NAND gate 91a and the second NAND gate 91b. The address signal $A_0$ is coupled to the second NAND gate 91b and the fourth AND gate 91d. The address signal $A_1$ is coupled to an input of the third NAND gate 91c and an input of the fourth AND gate 91d.

Outputs of the first, second, third and fourth NAND gates 91a–d are coupled respectively to an input of a first, second, third and fourth inverters 93a–d. Outputs of the first, second, third and fourth inverters are coupled to the shift registers 95a–d. Specifically, the output of the first inverter 93a is coupled to a first input A1 of the first shift register 95a and to a second input B2 of the second shift register 95b. The output of the second inverter 93b is coupled to a second input A2 of the second shift register 95b and to a first input B3 of the third shift register 95c. The output of the third inverter 93c is coupled to the second input A3 of the third shift register 95c and a first input B4 of the fourth shift register 95d. The output of the fourth inverter 93d is coupled to a second input A4 of the fourth shift register 95d and "loops back" to connect to a second input B1 of the first shift register 95a. Each shift register 95a–d are also provided the buffered clock signal CLKB as an input.

Figure 8A:
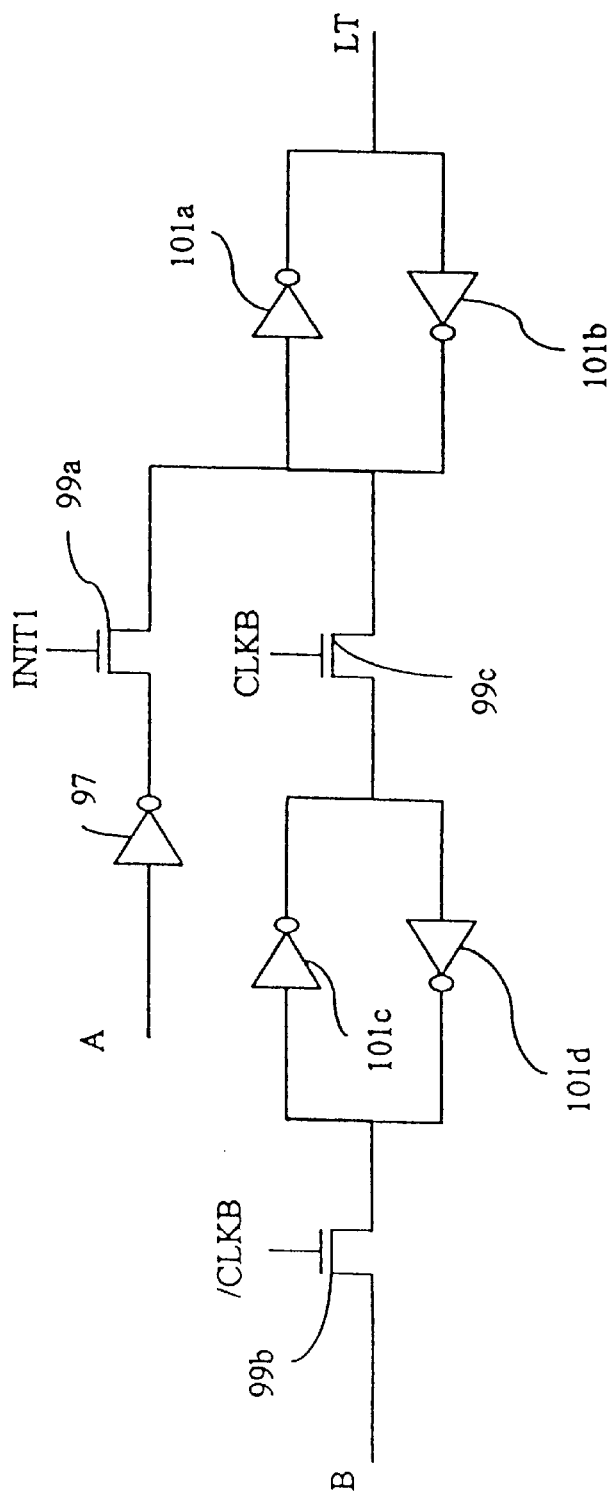
FIG. 8A illustrates a circuit semi-schematic of the shift registers of FIG. 8.

With the shift registers being provided, as inputs, the outputs of a previous inverter, the shift register is given information about the state of the next address. Using the state of the next address, the shift registers provide latch enable signals LT0–LT3 to a respective latch buffer quicker. FIG. 8a illustrates a schematic of one embodiment of the shift registers 95a–95d in FIG. 8. The input A represents inputs A1–A4 and input B represents inputs B1–B4. Similarly, the latch enable output LT represents latch enable signals LT0–LT3.

The first input A of the first shift register 95a is coupled to a first shift inverter 97. Output of the first shift inverter is coupled to the drain of a first transfer transistor 99a. A gate of the first transfer transistor is coupled to an initialize address signal INIT1. The initialize address signal INIT1 is an external signal provided by an initialization circuit (not shown). If the initialize address signal INIT1 is high, then the first transfer transistor 99a turns on. In other words, a first decoding signal D1 is transferred through the first transfer transistor to an input of a first latch inverter 101a and an output of a second latch inverter 101b. The first latch inverter 101a re-inverts and outputs the decoding signal D1.

The second input B of the first shift register 95a is oupled to a drain of a second transfer transistor 99b. A gate of the second transfer transistor is coupled to an inverted buffered clock signal /CLKB (FIG. 1). If the inverted buffered clock signal /CLKB is high, the then second transfer transistor 99b turns on. Thus, a look-ahead decoding signal LD1 is transferred through the second transfer transistor to an input of a third latch inverter 101c and an output of a fourth latch inverter 101d. The third latch inverts converts and provides the look-ahead decoding signal LD1 to a drain of a third transfer transistor 99c. A gate of the third transfer transistor 99c is coupled to the buffered clock signal CLKB. When the buffered clock signal is high, the third transfer transistor turns on and the inverted look-ahead decoding signal LD1 is transferred through the third transfer transistor to the input of the first latch inverter 101c and the output of the second latch inverter 101d. Since the inverted external clock signal is provided to the gate of the second transfer transistor 99b, the second transfer transistor turns off. Therefore, the decoding signal D1 is outputted by a shift register in one clock period and in the next clock period the look-ahead address signal is outputted by a shift register.

Therefore, the delay from one address to the next address to produce the appropriate latch enable signals LT0–LT3 is from the third transfer transistor through the first latch inverter. As a result, once the initial address is provided, the next address is predicted and thus the time to clock is reduced. Therefore, the data decoding path becomes a logical path from the external clock to the clock buffer to a portion of a shift register to the latches and out through the output buffer which is significantly shorter (in relation time) than the initial path from the external clock to the clock buffer to the address decoder to the decoder to the latches an out through the output buffer.

Accordingly, the present invention provides a burst mode flash memory. Although this invention has been described in certain specific embodiments, many additional modifications and variations would be apparent to those skilled in the art. It is therefore to be understood that this invention may be practiced otherwise than as specifically described. Thus, the present embodiments of the invention should be considered in all respects as illustrative and not restrictive, the scope of the invention to be determined by the appended claims and their equivalents rather than the foregoing description.

What is claimed is:

1. A burst mode flash memory device synchronously operating with an external clock, the burst mode flash memory device comprising:
   a memory cell array having a plurality of memory cells, each memory cell storing data;
   input circuits for selecting a subset of memory cells from the plurality of memory cells and generating an internal clock that is synchronized to the external clock, the input circuits including delay circuitry for delaying generation of the internal clock for at least one clock period upon receipt of predefined control signal;
   reader circuits fetching data stored in the subset of memory cells selected; and
   output circuits outputting the data fetched in a predetermined grouping and synchronously with the internal clock, such that the input circuits upon receipt of a predefined control signal, the generation of the internal clock is delayed for at least one clock period.

2. The burst mode flash memory device of claim 1 wherein the input circuits comprise:
   a delay circuit, the delay circuit receiving a signal corresponding to the predefined control signal and generating an internal enable signal which is a delayed version of the predefined control signal;
   an internal clock generator circuit, the internal clock generator circuit generating internal clock signals using an external clock signal, with at least one of the internal clock signals being generated only when the internal enable signal is in a first state.

3. The burst mode flash memory device of claim 2 wherein the input circuits further comprise an address buffer, the address buffer receiving address signal and generating decoded address signals therefrom using the at least one of the internal clock signals.

4. In a flash memory device having a memory cell array, an address decoder for processing address information used in accessing the memory cell array, a method of increasing reliability of access of the memory cell array, the method comprising:

receiving an output enable signal;

forming a delayed output enable signal by delaying the output enable signal a plurality of clock cycles;

providing the delayed output enable signal to an internal clock generator, the delayed output enable signal being used to enable an internal clock signal; and generating the internal clock signal for use in accessing the memory cell array based on the delayed output enable signal.

5. A flash memory device including a memory cell array, an address signal generator generating address signals for an address decoder, a clock buffer for generating an internal clock signal based on an external clock signal, and handshake circuit comprising a comparator which compares least significant address signals generated by the address signal generator and forms a control signal based on the comparison, a shift circuit for phase shifting the external clock signal and thereby forming a shifted clock signal, and a gate circuit for. gating the shifted clock signal using the control signal, whereby the shifted clock signal is used by the clock buffer in generating the internal clock signal.

6. In the flash memory device including a memory cell array, an address signal generator generating address signals for an address decoder, a clock buffer for generating an internal clock signal based on an external clock signal of claim 5, the handshake circuit additionally comprises a gate activated by the shifted clock signal, with the gate controlling an output signal used by the clock buffer in generating the internal clock signal.

7. In the flash memory device including a memory cell array, an address signal generator generating address signals for an address decoder, a clock buffer for generating an internal clock signal based on an external clock signal of claim 6, the handshake circuit additionally receives an input signal indicative of device power down, the input signal indicative of device power down overriding the activation of the gate by the shifted clock signal.

* * * * *